(12) United States Patent
Gambino et al.

(10) Patent No.: US 7,173,303 B2
(45) Date of Patent: Feb. 6, 2007

(54) FIN FIELD EFFECT TRANSISTOR WITH SELF-ALIGNED GATE

(75) Inventors: Jeffrey P. Gambino, Westford, VT (US); Jerome B. Lasky, Essex Junction, VT (US); Jed H. Rankin, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/695,335

(22) Filed: Oct. 28, 2003

(65) Prior Publication Data

US 2004/0092060 A1 May 13, 2004

Related U.S. Application Data

(62) Division of application No. 09/965,288, filed on Sep. 27, 2001, now Pat. No. 6,689,650.

(51) Int. Cl.
H01L 21/00 (2006.01)
H01L 27/108 (2006.01)
H01L 29/10 (2006.01)
H01L 29/04 (2006.01)

(52) U.S. Cl. ............... 257/302; 257/66; 257/72; 438/157; 438/159

(58) Field of Classification Search ............ 257/302, 257/66, 72; 438/157, 159
See application file for complete search history.

(56) References Cited

U.S. PATENT DOCUMENTS 5,574,294 A 11/1996 Shepard
5,646,058 A 7/1997 Taur et al.
5,739,057 A 4/1998 Tiwari et al.
5,963,800 A 10/1999 Augusto
6,004,837 A 12/1999 Gambino et al.
6,033,957 A 3/2000 Burns, Jr. et al.
6,077,745 A 6/2000 Burns, Jr. et al.
6,140,191 A 10/2000 Gardner et al.
6,174,794 B1 1/2001 Gardner et al.
6,180,501 B1 1/2001 Pey et al.
6,770,516 B2 * 8/2004 Wu et al. ............ 438/154
6,787,402 B1 * 9/2004 Yu ..................... 438/142

FOREIGN PATENT DOCUMENTS

JP 11-186557 7/1999

OTHER PUBLICATIONS

Chang L., "Industrial Planar FinFET Fabrication Using Standard Processing Tools,"(last modified Feb. 21, 2001), p. 1, <http://hera.berkeley.edu/IRO/Summary/01abstracts/leland.2.html>.
Choi, Y., et al., "Asymmetrical Double Gate FinFET," (last modified Feb. 21, 2001) p.1, <http://buffy.eecs.berkeley.edu/IRO/Summary/00abstracts/ykchoi.2.html>.

* cited by examiner

*Primary Examiner*—Long Pham
*Assistant Examiner*—Shrininvas H. Rao
(74) *Attorney, Agent, or Firm*—Scully, Scott, Murphy & Presser, P.C.; William D. Sabo, Esq.

(57) ABSTRACT

The present invention provides a process for fabricating a metal oxide semiconductor field effect transistor (MOSFET) having a double-gate and a double-channel wherein the gate region is self-aligned to the channel regions and the source/drain diffusion junctions. The present invention also relates to the FIN MOSFFET structure which is formed using method of the present invention.

8 Claims, 6 Drawing Sheets

FIN FIELD EFFECT TRANSISTOR WITH SELF-ALIGNED GATE

REFERENCE TO RELATED APPLICATIONS

This application is a divisional of application Ser. No. 09/965,288. filed Sep. 27, 2001, now issued as U.S. Pat. No. 6,689,650.

FIELD OF THE INVENTION

The present invention relates to semiconductor devices, and more particularly to a method of forming a metal oxide semiconductor field effect transistor (MOSFET) comprising thin vertical channels (i.e., the FIN) controlled by a double-gate, which involves using a trough to define the channel regions as well as the damascene gate, so as to provide a self-aligned gate. The present invention also relates to a sub-0.05 µm double-gated/double-channel FIN MOSFET structure wherein the gate is self-aligned to the channel regions as well as the source/drain junctions.

BACKGROUND OF THE INVENTION

Over the past twenty-five years or so, the primary challenge of very large scale integration (VLSI) has been the integration of an ever-increasing number of MOSFET devices with high yield and reliability. This was achieved mainly in the prior art by scaling down the MOSFET channel length without excessive short-channel effects. As is known to those skilled in the art, short-channel effects are the decrease of threshold voltage $V_t$ in short-channel devices due to two-dimensional electrostatic charge sharing between the gate and the source/drain diffusion regions.

To scale down MOSFET channel lengths without excessive short-channel effects, gate oxide thickness has to be reduced while increasing channel-doping concentration. However, Yan, et al., "Scaling the Si MOSFET: From bulk to SOI to bulk", IEEE Trans. Elect. Dev., Vol. 39, p. 1704, July 1992, have shown that to reduce short-channel effects for sub-0.05 µm MOSFETs, it is important to have a backside-conducting layer present in the structure that screens the drain field away from the channel. The Yan, et al. results show that double-gated MOSFETs and MOSFETs with a top gate and a backside ground plane are more immune to short-channel effects and hence can be scaled to shorter dimensions than conventional MOSFETs.

The structure of the prior art MOSFETs consists of a very thin vertical Si layer (FIN) for the channel, with two gates, one on each side of the channel. The two gates are electrically connected so that they serve to modulate the channel. Short-channel effects are greatly suppressed in such a structure because the two gates very effectively terminate the drain field line preventing the drain potential from being felt at the source end of the channel. Consequently, the variation of the threshold voltage with drain voltage and with gate length of a prior art double-gated MOSFET is much smaller than that of a conventional single-gated structure of the same channel length.

FIN MOSFETs offer potential benefits in performance as compared with conventional MOSFETs; See, for example, X. Huang, et al., IEDM Tech. Dig. 1999, p.67. However, in prior art FIN MOSFETs, the gate conductor is not self-aligned to the source/drain diffusion junctions or the channel regions. Therefore, there will be a large series resistance between the channel and the heavily doped source/drain diffusion junctions.

To date, there are no adequate means for fabricating double-gated FIN MOSFET structures in which the gate is self-aligned to the source/drain diffusion junctions and the channels. Thus, there is a continued need for developing a new and improved method of fabricating double-gated FIN MOSFETs in which such self-alignment between the gate and the source/drain diffusion junctions and channels is achieved.

SUMMARY OF THE INVENTION

One object of the present invention is to provide a double-gated/double-channel FIN MOSFET structure that has sub-0.05 µm channel lengths associated therewith.

Another object of the present invention is to provide a FIN MOSFET structure that has excellent short-channel characteristics.

A further object of the present invention is to provide a FIN MOSFET structure in which the variation in threshold voltage with drain voltage and with the gate length is substantially less than that of a singled-gated MOSFET structure of the same channel length.

A yet further object of the present invention is to provide a FIN MOSFET structure which has double the on-current as compared with conventional single-gated structures of the same channel length.

A still further object of the present invention is to provide a FIN MOSFET structure in which the gate is self-aligned to the source/drain diffusion junctions and channel regions thereby significantly reducing the series resistance between the channels and the heavily doped source/drain diffusion junctions.

These and other objects and advantages are achieved in the present invention by utilizing a method wherein a trough is employed, not only to define the regions where the channels are formed, but also to form a damascene gate. Such a method allows for the formation of a double-gated/double-channel FIN MOSFET structure in which the gate is self-aligned to the channel regions and the source/drain diffusion junctions.

One aspect of the present invention thus relates to a method of fabricating a double-gated/double-channel FIN MOSFET structure having a gate region that is self-aligned with the source/drain diffusion junctions and channel regions. Specifically, the method of the present invention comprises the steps of:

(a) forming at least one patterned region atop a surface of an insulating region, said at least one patterned region comprising a Si-containing layer present atop said insulating region, a pad oxide present atop said Si-containing layer and a polish stop layer present atop said pad oxide;

(b) forming planarizing insulating regions abutting each patterned region, said planarizing insulating regions are formed on exposed portions of said insulating region, said planarizing insulating region being co-planar with a top surface of said polish stop layer;

(c) forming a hardmask on a portion of said at least one patterned region, said hardmask being used to define channel regions in said at least one patterned region;

(d) selectively removing a portion of said hardmask, said polish stop layer and said pad oxide layer so as to expose a portion of said Si-containing layer thereby forming channels regions and a trough;

(e) forming a gate region in said trough; and (f) removing said polish stop layer and said pad oxide abutting said gate region so as to expose portions of said Si-containing layer and forming source/drain diffusion regions therein.

Another aspect of the present invention relates to a double-gated/double-channel FIN MOSFET structure which is formed utilizing the method of the present invention. Specifically, the inventive double-gated/double-channel FIN MOSFET comprises:

a bottom Si-containing layer;

an insulating region present atop said bottom Si-containing layer, said insulating region having at least one partial opening therein;

a gate region formed in said at least one partial opening, said gate region comprising two regions of gate conductor that are separated from channel regions by an insulating film, said insulating film having opposite vertical surfaces adjacent to the channel regions;

source/drain diffusion regions abutting said gate region, said source/drain diffusion regions having junctions that are self-aligned to the channels regions as well as the gate region; and insulating spacers that separate the gate region and the source/drain diffusion regions formed orthogonal to said insulating film.

DETAILED DESCRIPTION OF THE INVENTION

Figure 1:
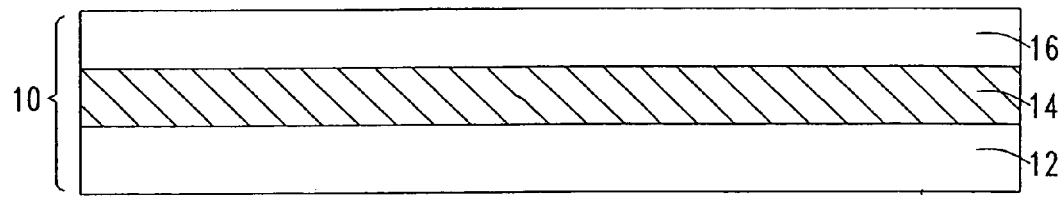
FIGS. 1–11 are pictorial representations (through cross-sectional and, in some instances, top views) showing the inventive double-gated/double-channel FIN MOSFET structure through various processing steps of the present invention.

The present invention, which provides a method of fabricating a FIN MOSFET structure having a gate region that is self-aligned with the source/drain diffusion junctions and channel regions as well as the FIN MOSFET structure itself, will now be described in greater detail by referring to the drawings that accompany the present application. It is noted that in the accompanying drawings, like and/or corresponding elements are referred to by like reference numerals.

Reference is first made to FIG. 1 which illustrates an initial structure that is employed in the present invention in fabricating the inventive FIN MOSFET structure. Specifically, the initial structure shown in FIG. 1 comprises silicon-on-insulating (SOI) material 10 which includes bottom Si-containing layer 12, insulating region 14, and top Si-containing layer 16. Note that the insulating region, i.e., buried oxide region, electrically isolates the bottom Si-containing layer from the top Si-containing layer. The term "Si-containing layer" as used herein denotes a semiconducting material that includes at least Si. Examples of such semiconducting materials, include, but are not limited to: Si, SiGe, SiGeC, SiC, polysilicon (i.e., polySi), epitaxial silicon (i.e., epi-Si), amorphous silicon (i.e., a:Si), and multilayers thereof. In one embodiment of the present invention, it is highly preferred that layers 12 and 14 of SOI material 10 are both composed of Si or polysilicon.

The thickness of top Si-containing layer 16 of SOI material 10 may vary, but typically, the Si-containing layer has a thickness of from about 10 to about 500 nm, with a thickness of from about 50 to about 150 nm being more highly preferred. Insofar as insulating region 14 is concerned, the insulating region typically has a thickness of from about 10 to about 1000 nm, with a thickness of from about 100 to about 500 nm being more highly preferred. The thickness of bottom Si-containing layer 12 of SOI material 10 is inconsequential to the present invention.

The SOI material shown in FIG. 1 may be made from a conventional process well known in the art. For example, the SOI material may be fabricated using a thermal bonding and cutting process, or alternatively, the SOI material is fabricated using a separation by ion implantation of oxygen (SIMOX) process.

Figure 2:
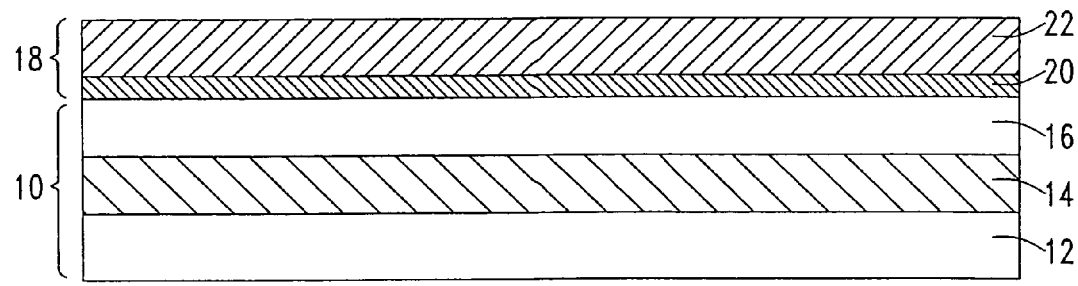

FIG. 2 illustrates the structure that is obtained after forming insulating stack 18 atop Si-containing layer 16. As shown, insulating stack 18 includes at least pad oxide layer 20 which is formed atop Si-containing layer 16 of the SOI material, and polish stop layer 22 which is composed of an insulating layer that has a different etch rate as compared to that of the underlying pad oxide layer. For example, the polish stop layer may be composed of a nitride such as SiN, or an oxynitride such as SiON, when the pad oxide is formed of $SiO_2$.

Pad oxide layer 20 of insulating stack 18 is formed utilizing a conventional deposition process such as chemical vapor deposition (CVD), plasma-assisted CVD, sputtering, evaporation, chemical solution deposition, or atomic layer deposition. Alternatively, and more preferably, pad oxide layer 20 is formed utilizing a conventional thermal oxidation process. The thickness of the pad oxide layer may vary depending on the type of oxide employed as well as the process used in forming the same. Typically, however, pad oxide layer 20 has a thickness of from about 5 to about 200 nm, with a thickness of from about 10 to about 50 nm being more highly preferred.

The polish stop layer, which is formed utilizing a conventional deposition process including low-pressure CVD, has a thickness of from about 50 to about 500 nm, with a thickness of from about 100 to about 200 nm being more highly preferred. It is noted that the thickness of the polish stop layer may vary somewhat from the ranges reported herein.

Figure 3:
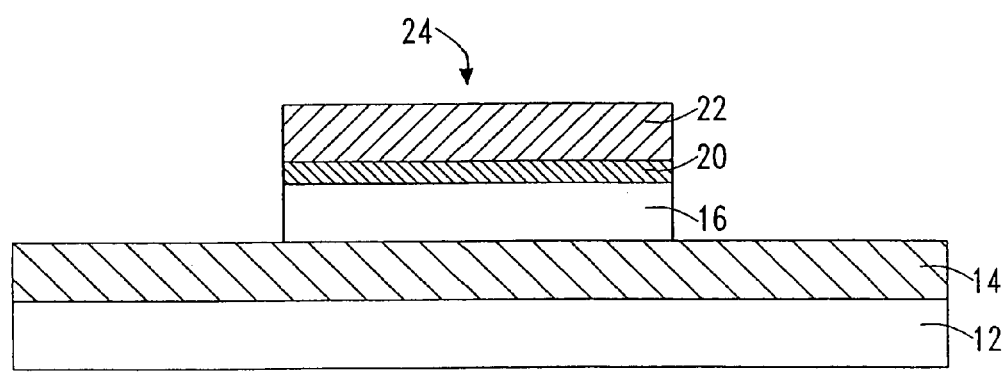

Next, and as shown in FIG. 3, at least one patterned region 24, which is comprised of patterned layers 22, 20 and 16, is formed utilizing conventional lithography and etching. The lithography step employed in forming the at least one patterned region includes the steps of forming a photoresist atop polish stop layer 22; exposing the photoresist to a pattern of radiation; and developing the pattern in the photoresist utilizing a conventional resist developer. The etching step employed in forming patterned region 24 comprises a conventional dry etching process such as reactive-ion etching (RIE), ion beam etching (IBE), plasma etching, laser ablation or any combination thereof which is capable of removing exposed regions of layers 22, 20 and 16, while stopping on insulating region 14.

Following the etching process, the patterned resist is removed providing the structure shown in FIG. 3. Note that patterned region 24 defines the active area, See FIG. 4B, of the inventive structure. It is also noted that although the drawings depict the formation of only one patterned region, the present invention contemplates forming a plurality of such patterned regions on the structure.

Figure 4A:
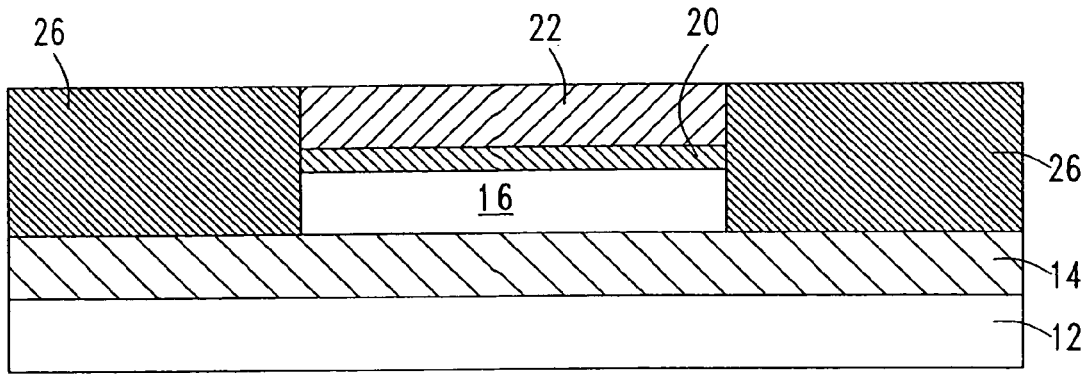
Figure 4B:

FIGS. 4A(cross-sectional view)–4B (top view) show the structure that is obtained after planarizing isolation regions 26 are formed abutting patterned region 24. The planarizing isolation regions are formed by first depositing, via conventional deposition processes such as low-pressure CVD, an oxide layer such as $SiO_2$ over all exposed surfaces of the structure shown in FIG. 3, and thereafter planarizing the deposited oxide layer down to the top surface of polish stop layer 22 utilizing a conventional planarization process such as chemical-mechanical polishing (CMP) or grinding.

Patterned hardmask 28 is then formed atop the uppermost layer of patterned region 24, i.e., atop polish stop layer 22, utilizing a conventional deposition process such as low-pressure CVD, followed by conventional lithography and etching. The resultant structure obtained after these steps of the present invention is shown, for example, in FIG. 5.

Patterned hardmask 28 has a width of about 50 nm or less, with a width of from about 5 to about 50 nm being more highly preferred. The vertical thickness of the patterned hardmask is typically of from about 50 to about 500 nm, with a vertical thickness of from about 100 to about 200 nm being more highly preferred. Note that the patterned hardmask may be composed of the same or different oxide as planarizing insulating regions 26 and that the patterned hardmask is employed in the present invention in defining channel regions 35.

Figure 5:
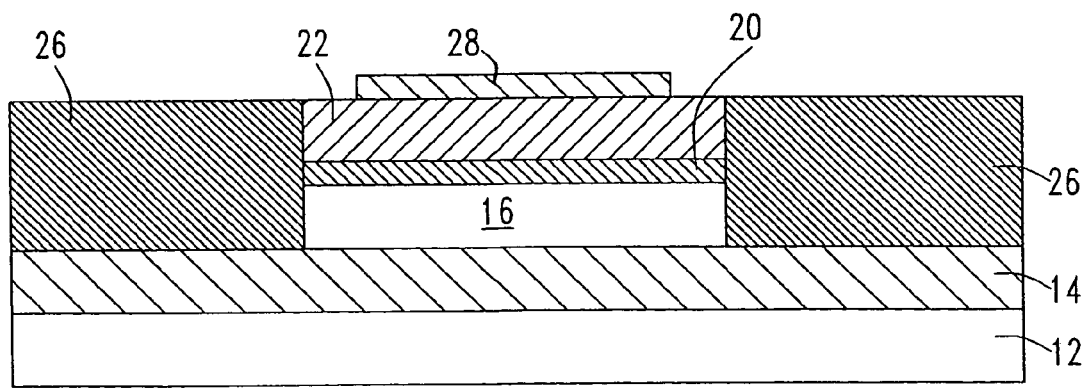
Figure 6A:
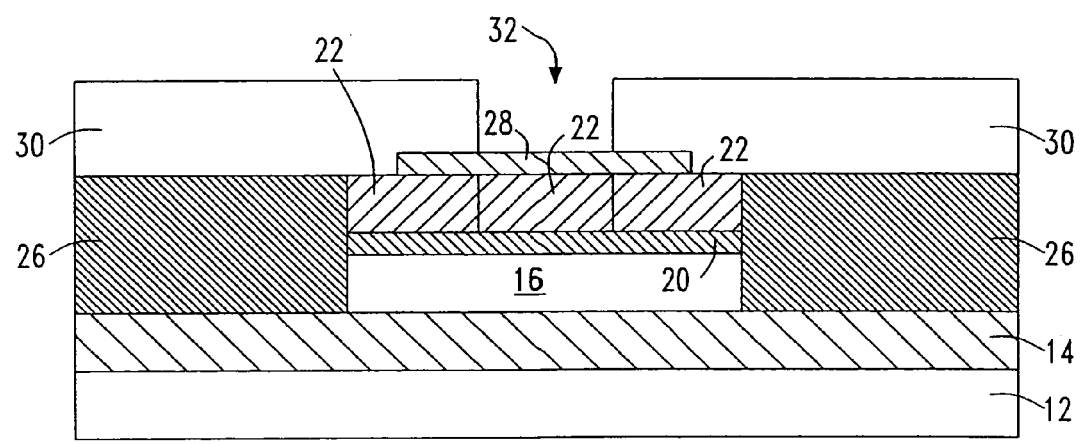

Next, and as illustrated in FIGS. 6A (cross-sectional)–6B (top view), patterned photoresist 30 having at least one opening 32 exposing a portion of patterned hardmask 28 is then formed over the structure shown in FIG. 5. Specifically, patterned resist 30 having opening 32 is formed utilizing conventional lithography as described hereinabove. It is noted that this step of the present invention defines the regions where the gate conductor will be subsequently formed. At this point of the present invention, any polish stop layer that is adjacent to the channel region, not protected by patterned hardmask 28, is removed utilizing a selective RIE process.

Figure 6B:
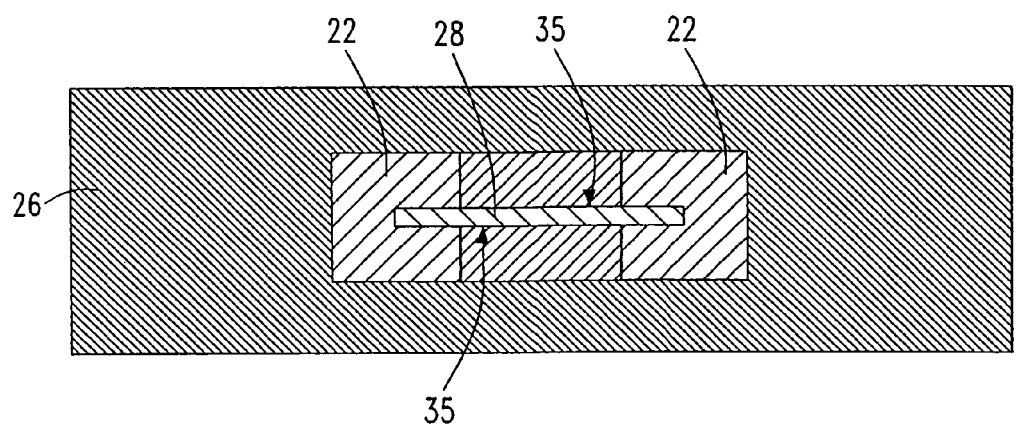

To define the structure shown in FIGS. 6A–6B, that structure is subjected to selective etching processes that are capable of removing the exposed portions of patterned hardmask 28 as well as the underlying portions of polish stop layer 22 stopping on a portion of pad oxide layer 20. The resulting structure formed after these selective etching processes is shown, for example, in FIGS. 6A (cross-sectional)–6B (top view). The selective etching processes used at this point of the present invention include the use of a first etching process that selectively removes oxide as compared to nitride, and a second etching process which selectively removes nitride as compared to oxide.

The first etching process may comprise the use of a fluorine-containing gas or plasma having an etch selectivity of at least about 20:1, whereas the second etching process may include the use of Cl-based chemistries having an etch selectivity of at least about 10:1. Note that the second etching process defines channel regions 35 of the inventive structure.

Figure 7A:
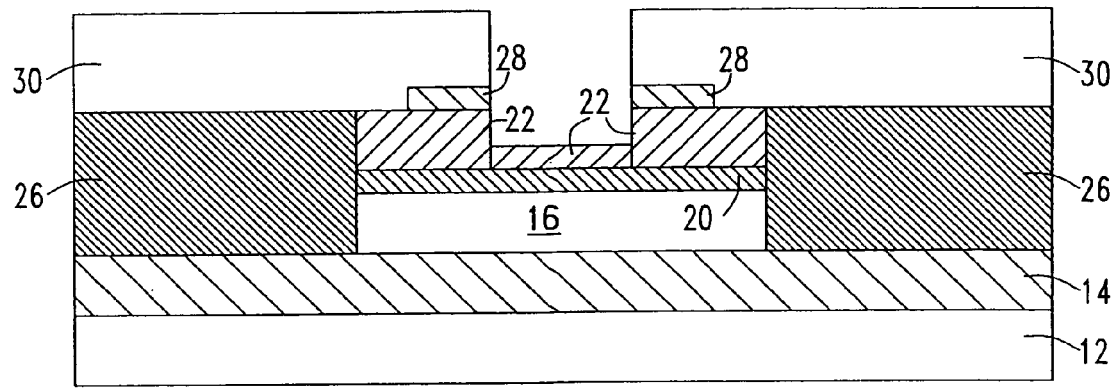
Figure 7B:
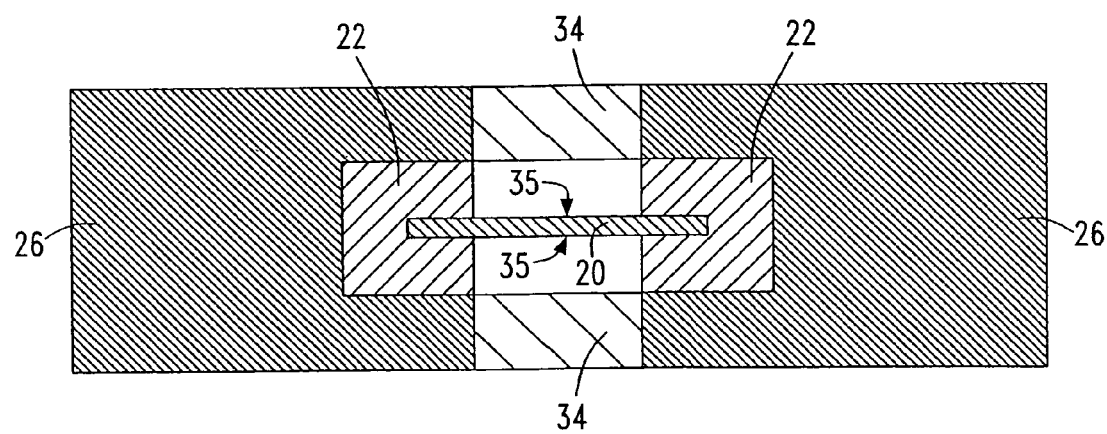

FIGS. 7A–7B show the resultant structure after conducting the selective etching processes which provide troughs 34 in the isolation regions for the gate conductors. The etch is a fluorine-base chemistry that etches $SiO_2$ selective to $Si_3N_4$.

Figure 8:
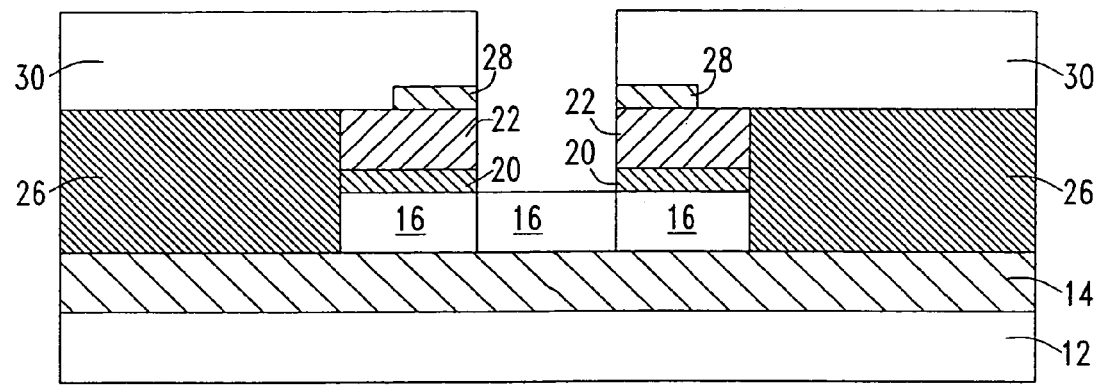

This selective etching processes also removes the exposed portions of pad oxide 20 from the regions adjacent to the channel (i.e., those regions not protected by hardmask 22). See, for example, in FIG. 7B. The structure shown in FIG. 8 is obtained by utilizing a third selective etching process in which a chlorine-containing etching gas or plasma having an etch selectivity of at least about 10:1 is employed. This etches the exposed Si adjacent to hardmask 22, leaving a vertical Si FIN that defines the channel regions. Following the third selective etching process, the resist is removed utilizing a conventional stripping process well known to those skilled in the art. Note that portions of hardmask 28 are also removed at this point of the present invention.

After stripping the resist from the structure, a sacrificial oxide layer (not shown) is formed by conventional thermal growing processes on the exposed wall portions of the trough, the sacrificial oxide is thereafter removed using a chemical etchant such as HF, and an oxide layer (not shown) is then formed on the exposed, and now cleaned, tough sidewalls.

Figure 9A:
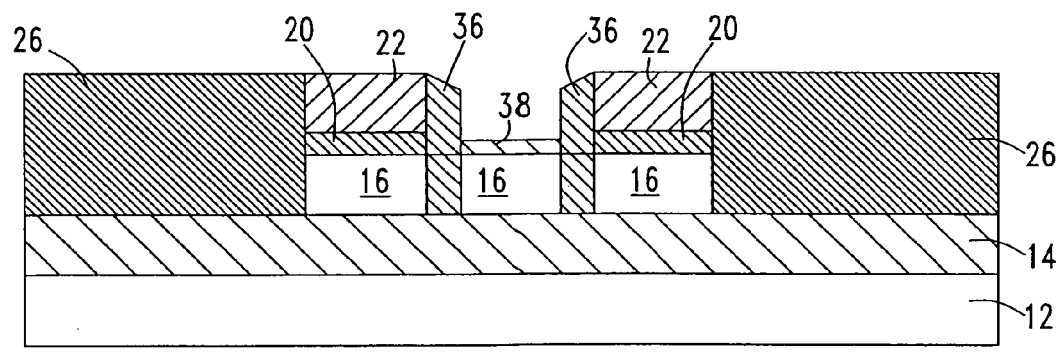

FIGS. 9A(cross-section)–9B(top view) show the resultant structure that is obtained after insulating spacers 36 and gate dielectric 38 are formed in the trough. Specifically, the insulating spacers are formed utilizing a conventional deposition process such as low-pressure CVD and etching, e.g., RIE wherein a fluorine-based plasma is employed. Note that over-etching is typically employed so as to remove spacers from the channel regions. The thickness of hardmask 22 should be greater than the thickness of Si layer 16 so that spacers remain adjacent to the source/drain diffusion regions, but not on the channel regions. Insulating spacers 36 are comprised of an oxide, a nitride, an oxynitride or any combination and multilayer thereof.

Next, a sacrificial oxide layer (not shown) is formed, as described above, then the sacrificial oxide layer is removed, as described above, and thereafter gate dielectric 38 is formed by utilizing a conventional deposition process. Alternatively, a conventional thermal growing process may be used in forming the gate dielectric.

The gate dielectric formed at this point of the present invention may include an oxide, a nitride, an oxynitride or any combination thereof including multilayers. A preferred gate dielectric employed in the present invention is an oxynitride such as SiON.

The thickness of the gate dielectric formed at this point of the present invention may vary depending on the gate dielectric material as well as the process used in forming the same. Typically, gate dielectric 38 has an effective electrical thickness assuming the dielectric constant is equal to that of $SiO_2$ of from about 1 to about 5 nm, with a thickness of from about 1 to about 2 nm being more highly preferred.

Figure 9B:
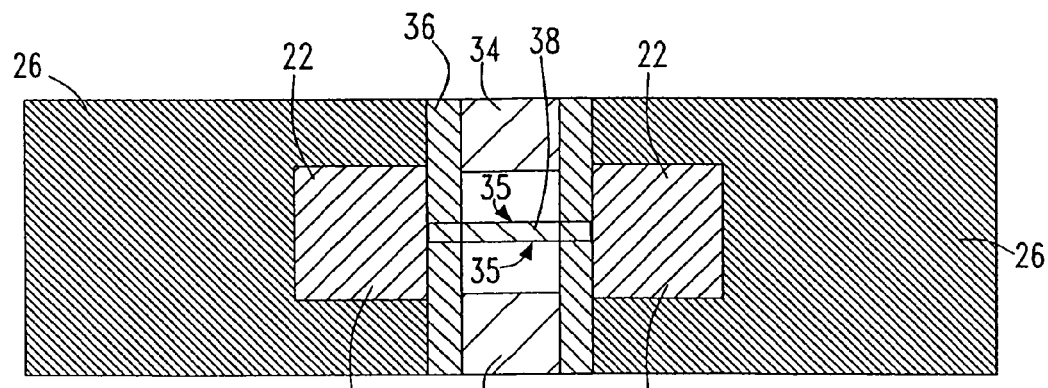
Figure 10:
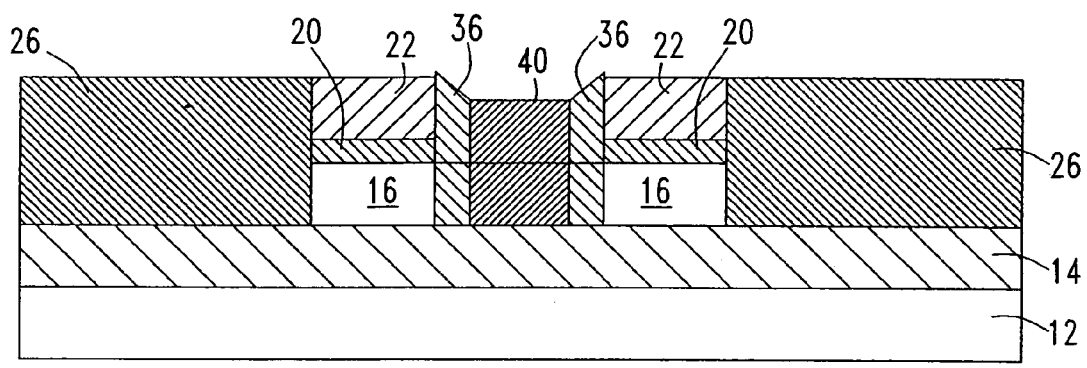

Following the formation of the insulating spacers and gate dielectric, gate conductor 40 is formed over the channel and the trough regions shown in FIGS. 9A–9B. The resultant structure after formation of gate conductor 40 is shown in FIG. 10. Note that the top surface of the gate conductive material is co-planar with the top surface of isolation regions 26. Specifically, the gate conductor material is deposited utilizing a conventional deposition process including low-pressure CVD and thereafter a conventional planarization process such as CMP is employed.

The gate conductor material used at this point of the present invention includes any conductive material which is typically employed in MOSFET devices. For example, the gate conductive material employed in the present invention may be comprised of polysilicon, amorphous Si, elemental metals that are conductive, alloys of conductive elemental metals, silicides or nitrides of conductive elemental metals and multilayers thereof, e.g., a conductive gate stack including, for example, a layer of polysilicon and a conductive elemental metal. When a conductive gate stack is employed, a conventional diffusion barrier such as Ta, Ti, TaN or TiN may be formed between the conductive layers.

Polish stop layer 22 and pad oxide layer 20 are then removed from the structure utilizing conventional wet etching processes or a chemical down stream dry etching process well known in the art so as to expose portions of underlying Si-containing layer 16. The exposed portions of the Si-containing layer are then subjecting to a ion implantation process wherein an ion (n- or p-type) is implanted using an ion dose on the order of about 1E15 atoms/cm² or greater. Following ion implantation, the doped regions of the Si-containing layer are annealed at a temperature of about 700° C. or greater so as to form activated source/drain diffusion regions 42 that have junction regions which are self-aligned to the gate edges.

Figure 11A:
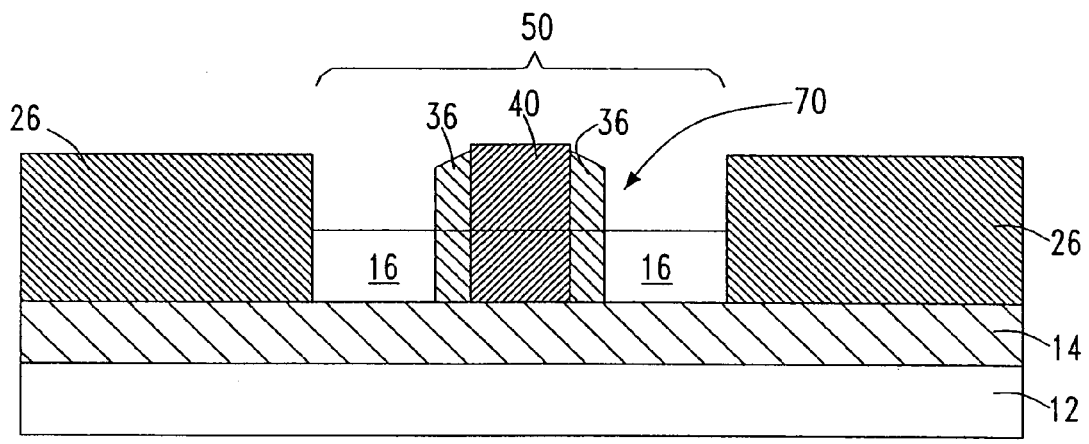
Figure 11B:
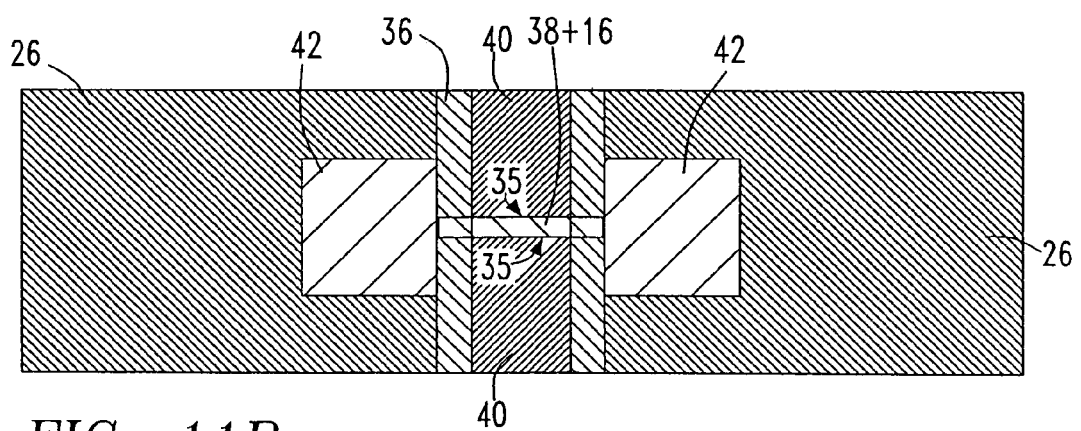

The resultant structure obtained using the inventive process is shown, for example, in FIG. 11A (cross-sectional) and B (top view). Specifically, the inventive structure includes bottom Si-containing layer 12, an insulating region (14 and 26) present atop the bottom Si-containing layer. Insulating region (14+26) having at least one partial opening 50 therein. A gate region 70 formed in the partial opening, said gate region comprising two regions of gate conductor 40 that are separated from channel regions 35 by insulating film, i.e., gate dielectric, 38 which surrounds a portion of Si-containing layer 16, said insulating film having opposite vertical surfaces adjacent to channel regions 35; source/drain diffusion regions 42 abutting said gate region, said source/drain diffusion regions having junctions that are self-aligned to the channels regions as well as the gate region; and insulating spacers 36 that separate gate region 70 and source/drain diffusion regions 42 formed orthogonal to insulating film 38.

In addition to the processing steps mentioned above, the present invention also contemplates other conventional MOSFET processing steps that are well known in the art. For example, the present invention also contemplates forming salicide regions atop the source/drain diffusion regions, and forming contacts and/or interconnects over the salicide regions.

While the present invention has been particularly shown and described with respect to preferred embodiments thereof, it will be understood by those skilled in the art that the foregoing and other changes in forms and details may be made without departing from the scope and spirit of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A double-gated/double-channel FIN metal oxide semiconductor field effect transistor (MOSFET) comprising:

a bottom Si-containing layer;

an insulating region present atop said bottom Si-containing layer, said insulating region having at least one partial opening therein;

a gate region formed in said partial opening, said gate region comprising two regions of gate conductor that are separated from vertical fin-shaped silicon-containing channel regions by an insulating film, said insulating film comprising a gate dielectric and having opposite vertical surfaces adjacent to the vertical fin-shaped silicon-containing channel regions;

source/drain diffusion regions abutting said gate region, said source/drain diffusion regions having junctions that are self-aligned to the vertical fin-shaped silicon-containing channels regions and the gate region; and insulating spacers in said partial opening that separate the gate region and the source/drain diffusion regions formed orthogonal to said insulating film;

wherein said gate region is between said insulating spacers; and wherein the gate region is self-aligned to the source/drain diffusion regions and the vertical fin-shaped silicon-containing channel regions.

2. The FIN MOSFET of claim 1 wherein said insulating region includes an insulating layer of an SOI material.

3. The FIN MOSFET of claim 2 wherein said partial opening exposes a portion of said insulating layer of said SOI material.

4. The FIN MOSFET of claim 1 wherein said insulating film is formed surrounding a portion of a Si-containing layer.

5. The FIN MOSFET of claim 4 wherein the gate dielectric of said insulating film is comprised of an oxide, a nitride, an oxynitride or any combination or multilayer thereof.

6. The FIN MOSFET of claim 1 wherein said regions of gate conductor are each comprised of polysilicon, amorphous Si, a conductive elemental metal, an alloy of a conductive elemental metal, a nitride or silicide of a conductive elemental metal or multilayers thereof.

7. The FIN MOSFET of claim 1 further comprising salicide regions formed atop said source/drain diffusion regions.

8. The FIN MOSFET of claim 1 wherein said source/drain diffusion regions are formed in a portion of a patterned Si-containing layer.

* * * * *